United States Patent
Dawson et al.

(10) Patent No.: US 7,176,725 B2
(45) Date of Patent: Feb. 13, 2007

(54) FAST PULSE POWERED NOR DECODE APPARATUS FOR SEMICONDUCTOR DEVICES

(75) Inventors: James W. Dawson, Poughkeepsie, NY (US); Donald W. Plass, Poughkeepsie, NY (US); Kenneth J. Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 11/050,895

(22) Filed: Feb. 4, 2005

(65) Prior Publication Data

US 2006/0176081 A1  Aug. 10, 2006

(51) Int. Cl.
*H03K 19/094* (2006.01)
*H03K 19/096* (2006.01)

(52) U.S. Cl. .................. 326/105; 326/98

(58) Field of Classification Search .......... 326/93, 326/95, 98, 104–105
See application file for complete search history.

(56) References Cited

U.S. PATENT DOCUMENTS

| | | | |
|---|---|---|---|
| 6,060,910 A * | 5/2000 | Inui | 326/98 |
| 6,172,531 B1 * | 1/2001 | Aipperspach et al. | 326/108 |
| 6,225,826 B1 * | 5/2001 | Krishnamurthy et al. | 326/93 |
| 6,327,215 B1 | 12/2001 | Ternullo, Jr. et al. | 365/230.06 |
| 6,356,503 B1 | 3/2002 | Roy | 365/230.06 |
| 6,369,617 B1 * | 4/2002 | Kanetani et al. | 326/105 |
| 6,373,290 B1 | 4/2002 | Forbes | 326/98 |
| 6,456,118 B2 * | 9/2002 | Beat | 326/105 |
| 6,690,205 B2 | 2/2004 | Alvandpour | 326/98 |
| 6,720,216 B2 | 4/2004 | Forbes | 438/257 |
| 6,750,677 B2 * | 6/2004 | Sumita | 326/94 |
| 6,825,691 B1 * | 11/2004 | Chu et al. | 326/46 |
| 6,826,074 B2 | 11/2004 | Yamauchi | 365/154 |
| 2002/0180485 A1 * | 12/2002 | Sumita | 326/96 |
| 2003/0206037 A1 | 11/2003 | Forbes | 326/98 |
| 2004/0041591 A1 | 3/2004 | Forbes | 326/95 |
| 2004/0095162 A1 | 5/2004 | McCurdy et al. | 326/121 |
| 2006/0176194 A1 * | 8/2006 | Dawson et al. | 341/50 |

* cited by examiner

*Primary Examiner*—Rexford Barnie
*Assistant Examiner*—Jason Crawford
(74) *Attorney, Agent, or Firm*—Cantor Colburn LLP

(57) ABSTRACT

A decoder circuit includes a pulse powered stage having a plurality of fan-in inputs thereto, a dynamic stage fed by the pulse powered stage, and a replica node selectively coupled to an output node of the pulse powered stage by a pass device. The pass device and the dynamic stage are controlled by a clock signal so as to enable a self-timed evaluation of the pulse-powered stage with a clocked enablement of the dynamic stage.

19 Claims, 4 Drawing Sheets

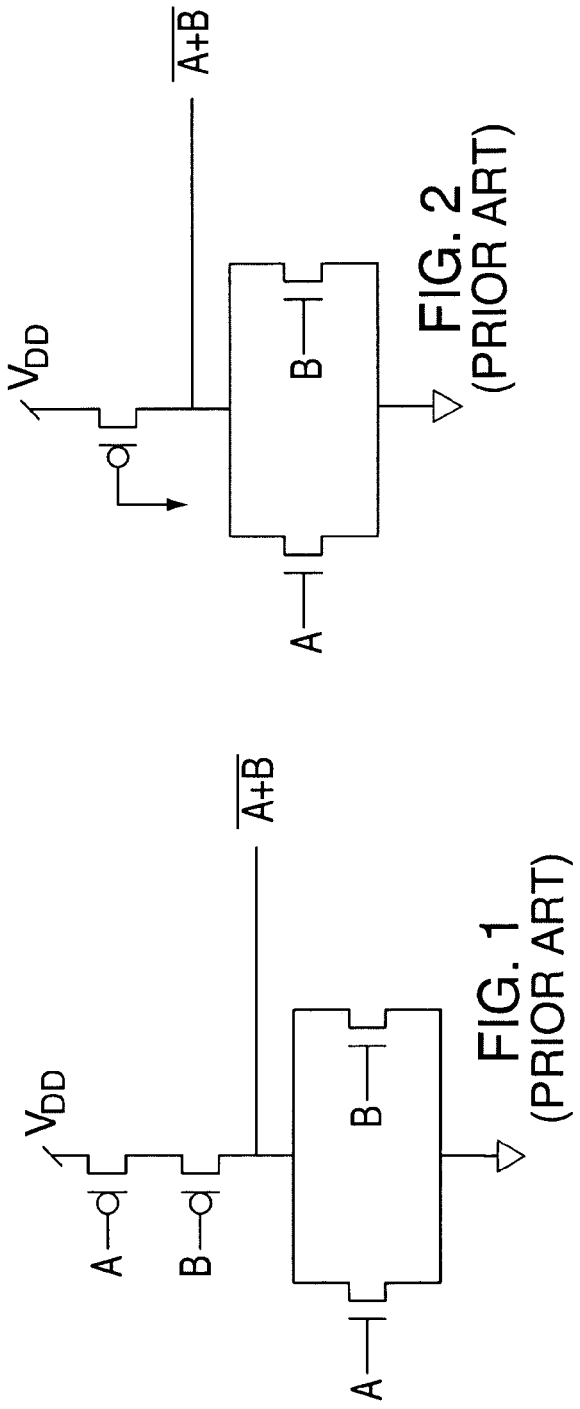
FIG. 1 (PRIOR ART)
FIG. 2 (PRIOR ART)
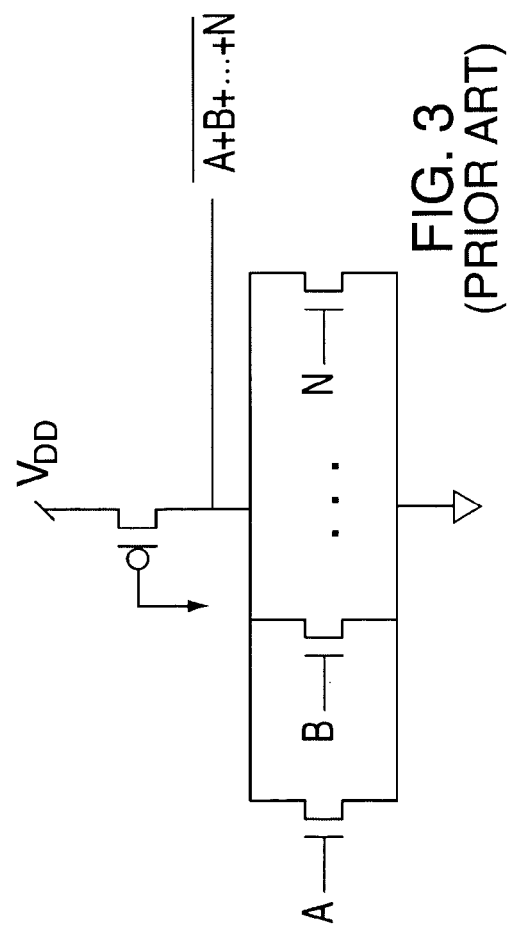
FIG. 3 (PRIOR ART)

FAST PULSE POWERED NOR DECODE APPARATUS FOR SEMICONDUCTOR DEVICES

BACKGROUND

The present invention relates generally to integrated circuit devices, and, more particularly, to a fast, pulse-powered NOR decode apparatus for semiconductor devices.

Complementary Metal Oxide Semiconductor (CMOS) technology is a popular technology not only for digital integrated circuits, but also for analog integrated circuits due to the low power dissipation, high density of integration, and low cost of fabrication properties associated therewith. CMOS includes n-type (NMOS) devices, whose source/drain current path turns on when the gate is biased more positively than the source, and p-type (PMOS) devices, which turn on when the gate is biased more negatively than the source potential. With these two complementary device types it is possible to construct logic circuits that have very low static (DC) power.

One of the problems in conventional static CMOS logic is the series connection of devices used in logic gates. For example, FIG. 1 illustrates a standard two-input CMOS static NOR gate. As is shown, the gate inputs A and B are coupled to a respective pair of series PFET transistors, as well as a pair of parallel NFET transistors. This results in a large area for static CMOS circuits, as well as a larger input capacitance. In addition, for PFET transistors, the hole mobility is about three times lower than the mobility of electrons if the transistors have comparable sizes. Accordingly, switching transients are very asymmetrical, in that the charge up transient of the capacitive load in a simple inverter (for example) takes longer than the discharge transient. To attempt to compensate, the PFET transistors are often fabricated with a large width or size to provide symmetrical switching. However, this increases the stray capacitive loads and results in an even larger area for the circuits and very inefficient area utilization. Such problems are even further exacerbated for gates having several inputs (fan-in).

An alternative logic family to static CMOS that is also often employed is what is referred to as pseudo-NMOS. An exemplary pseudo-NMOS circuit configuration of the NOR gate is shown in FIG. 2. Pseudo-NMOS technology differs from CMOS in that each input drives only a single transistor gate (i.e., each gate input is coupled to an NFET), while a PFET device has its gate grounded so as to be connected a load. This technology also has certain disadvantages, however. For a wide fan-in implementation of the pseudo-NMOS NOR circuit, as shown in FIG. 3, leakage in the NFETs of the combined parallel pull down structure can become problematic, even if the static inputs thereto are zero. Also, if a faster rise time is desired, the PFET current must be increased, which in turn raises both the power consumption and the output voltage for the zero state. Thus, although wiring complexity and device area is significantly reduced with pseudo-NMOS, static DC power consumption is increased, and noise margins are decreased.

Still another type of logic, commonly known as dynamic domino logic, offers certain advantages over static CMOS technology while retaining desirable low power dissipation characteristics. Compared to static CMOS circuits, domino logic also reduces the number of devices required to implement a particular function, leading to reduced capacitive loading and circuit size. With domino logic, a standard cell formed with a plurality of transistors represents a stage. A plurality of the stages can be cascaded or connected in series to implement the domino logic. A signal delivered to the first stage is evaluated, and the first stage produces an output signal that propagates to the second stage where the output signals of the first stage are evaluated. The second stage then produces additional output signals that, in turn, are propagated to the third stage wherein they are evaluated, and so on.

Notwithstanding the advantages offered by pseudo-NMOS logic and dynamic domino logic, in order to reduce the delay through a logic device such as an address decoder for example, a faster approach is continually sought that minimizes not only the delay from a clock, but also the setup time of the address inputs relative to the clock signal, along with the input capacitance and the power consumption.

SUMMARY

The foregoing discussed drawbacks and deficiencies of the prior art are overcome or alleviated by a decoder circuit, including a pulse powered stage having a plurality of fan-in inputs thereto, a dynamic stage fed by the pulse powered stage, and a replica node selectively coupled to an output node of the pulse powered stage by a pass device. The pass device and the dynamic stage are controlled by a clock signal so as to enable a self-timed evaluation of the pulse-powered stage with a clocked enablement of the dynamic stage.

In another embodiment, a pulse powered NOR decoder circuit, includes a pulse powered, pseudo-NMOS logic NOR stage having a plurality of fan-in inputs thereto, a dynamic AND stage fed by the pulse powered NOR stage, and a replica node selectively coupled to an output node of the NOR stage by a pass device. The pass device and the dynamic stage are controlled by a clock signal so as to enable a self timed evaluation of the pulse powered stage with a clocked enablement of the dynamic stage. A pull up device of the pseudo-NMOS NOR stage is configured to precharge the replica node to a logic high voltage prior to an evaluation of said NOR stage while the pass device isolates the replica node from the output node of said NOR stage.

BRIEF DESCRIPTION OF THE DRAWINGS

Referring to the exemplary drawings wherein like elements are numbered alike in the several Figures:

FIG. 1 is a schematic diagram of a conventional, two-input CMOS static NOR gate;

FIG. 2 is a schematic diagram of a pseudo-NMOS circuit implementation of the NOR gate of FIG. 1; and FIG. 3 is a schematic diagram of a large fan-in implementation of the pseudo-NMOS NOR gate of FIG. 2;

DETAILED DESCRIPTION

Disclosed herein is a decode circuit providing a fast output whose delay is mostly independent of the number of address or control inputs thereto. Briefly stated, the decode circuit includes a pulse-powered NOR circuit that feeds a dynamic AND circuit. A negative pulse is applied to a PFET load device associated with a pseudo-NMOS NOR gate such that the static inputs thereto need only drive the NFET pull down devices themselves, but that can still be evaluated during the evaluation period without suffering from conventional charge sharing problems. The negative pulse is also fed to an inverter stage for generating a positive clock pulse that in turn activates an NFET pass transistor between the NOR output and a replica node of the NOR output, and deactivates the PFET precharge device for the replica node that forms the logical input to the AND gate. The positive pulse is also used as the second of the two inputs to the NAND gate portion of the dynamic AND circuit. Thereby, a self-timed NOR evaluation and a clocked AND gate is implemented simultaneously.

Figure 4:
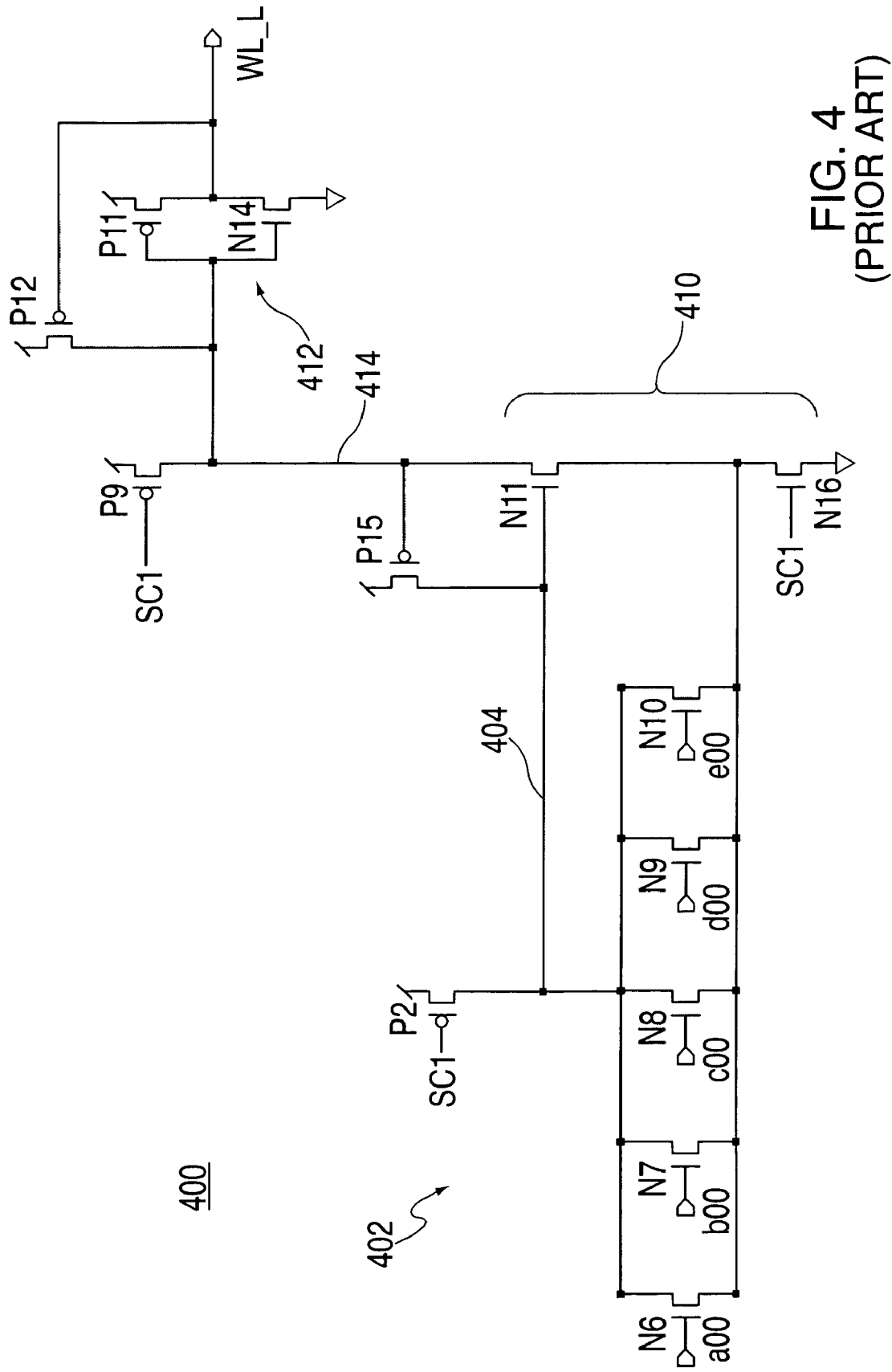
FIG. 4 is a schematic diagram of an existing NOR decode circuit.

Referring initially to FIG. 4, a schematic diagram of an existing NOR decode circuit 400 is illustrated. Decode circuit 400 generally includes a dynamic NOR stage 402, having a plurality of NFET pull down devices N6, N7, N8, N9, N10, the inputs thereto representing address bits a00, b00, c00, d00, and e00, respectively. The dynamic NOR stage 402 further includes a PFET pull up device P2, which is controlled by clock signal SC1.

The output node 404 of the NOR stage 402 is coupled to a NAND stage 410, and in particular, to the top NFET N11 of the NAND stack. The bottom NFET N16 is controlled by the positive clock signal SC1. An inverter buffer 412 (P11 and N14) is coupled to the output node 414 of the NAND stage 410. The output node WL_L is the decoded signal output of the decode circuit 400. In addition, pull up device P12 serves as a half-latch for stabilizing the output node 414 of NAND stage 410 from leakage current through NAND devices N11 and N16. PFET P9 is another pull up device for precharging the NAND output high (and thus maintaining decoder output WL_L at an initial low condition prior to the evaluation period). Accordingly, P9 is also controlled by positive clock pulse SC1, which is low prior to the evaluation period. PFET P15 is configured as an active restore device of the NOR output node 404 after the dual activation of NAND devices N11 and N16 for glitch suppression purposes.

The above-described configuration in FIG. 4 of a multiple-input NOR gate and 2-way AND gate in parallel therewith offers an improvement over simple CMOS NOR circuitry and clocked dynamic NOR circuitry by forming a faster, high fan-in NOR function that responds with a positive output pulse for the selected decoder, while the unselected decoders remain in the zero state. Unfortunately, one of the deficiencies inherent in the decoder circuit 400 of FIG. 4 is that the parallel combination of the NOR input devices results in a large negative noise glitch on the common drain node 404 when all the address inputs switch low simultaneously. This capacitive coupling reduces the gate potential on the upper device N11 of the NAND stack 410, thereby reducing the current therethrough and slowing down the overall circuit.

Figure 5:
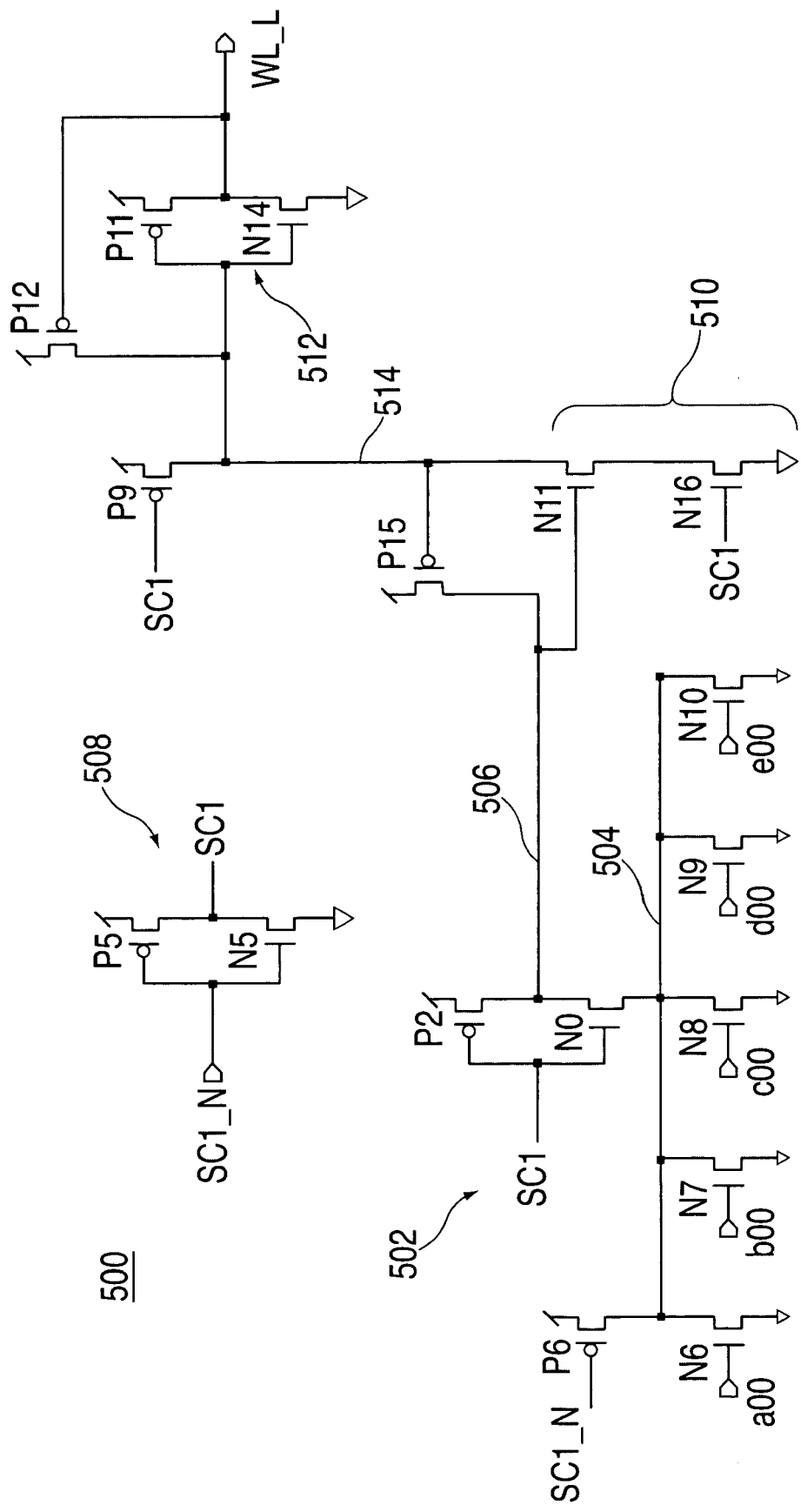
FIG. 5 is a schematic diagram of a pulse-powered NOR decode circuit, in accordance with an embodiment of the invention.

Therefore, in accordance with an embodiment of the invention, FIG. 5 is a schematic diagram of a fast pulse-powered NOR decode circuit 500. As is shown, decode circuit 500 includes a pulse-powered pseudo-NMOS NOR stage generally indicated at 502, and including a plurality of NFET pull down devices N6, N7, N8, N9, N10, the inputs thereto representing address bits a00, b00, c00, d00, and e00, respectively. In addition to PFET pull up devices P2 and P6, the NOR stage 502 further includes an NFET pass transistor N0 coupled between the output node 504 of the NOR stage 502 and P2. The resulting node 506 between N0 and P2 thus becomes a dynamic replica of the NOR output node 504 when N0 is activated.

A negative clock pulse SC1_N is used to active load device P6, in addition to being input to an inverter 508 (P5, N5) that generates a corresponding positive clock pulse SC1 when SC1_N goes low. Positive pulse SC1 is coupled to both N0 and P2 such that when SC1_N is initially is high, SC1 is low, which allows replica NOR node 506 to be precharged to high. The positive clock pulse SC1 is used to gate one of the NFETs (N16) of a NAND stage 510 of the decode circuit. In a later described alternative embodiment, SC1 gates the bottom NFET N16 of the NAND stage 510, while the replica node 506 is coupled to the input of the top NFET N11 of NAND stage 510.

To complete the dynamic AND functionality of the decode circuit 500, an inverter buffer 512 (P11 and N14) is coupled to the output node 514 of the NAND stage 510. The output node WL_L is the decoded signal output of the decode circuit 500. In addition, pull up device P12 serves as a half-latch for stabilizing the output node 514 of NAND stage 510 from leakage current through NAND devices N11 and N16. PFET P9 is another pull up device for precharging the NAND output high (and thus maintaining decoder output WL_L at an initial low condition prior to the evaluation period). Accordingly, P9 is also controlled by positive clock pulse SC1, which is low prior to the evaluation period. Finally, PFET P15 is configured as an active restore device of the replica node 506 after the dual activation of NAND devices N11 and N16 for glitch suppression purposes.

In operation of the decoder circuit, SC1_N is high which creates a low signal output for positive clock signal SC1 following a single stage delay through inverter 508. During this precharge phase of the SC1 clock signal, NFET pass gate N0 is rendered non conductive while, at the same time, load PFET P2 is conductive so as to precharge replica node 506 to a logic high voltage (e.g., $V_{DD}$); Pseudo-NMOS NOR gate output node 504 is thus isolated from replica node 506, and may be pulled toward ground by one or more static high signals on the address bits a00 through e00. Because the precharged replica node 506 is isolated from NOR output node 504 during precharge, the NOR inputs are free to switch randomly without causing DC power consumption or disturbing the node 506 voltage. Again, the NAND stage is also deactivated during the precharge stage and thus does not pass the signal from the NOR stage 502 as it is gated by the same positive clock signal SC1.

Once SC1_N goes low, the positive clock signal SC1 switches to high following a single inverter stage delay, and the evaluation period begins. If any of the address bits are high during the evaluation period, N0 will couple replica node 506 to output NOR node 504, pulling node 506 toward ground. Half latch device P12 helps maintain node 514 at its precharged high level to prevent P11 from turning on and causing glitches on the output WL_L for the unselected decoders. As such, output WL_L correctly reflects the value of decoder circuit (low) for the case when any of the address bits are high, since node 514 is not discharged. Following the evaluation phase, SC1 returns to low, which causes P2 to precharge replica node back to logic high and decoupling the output of the NOR stage 502 from the output of the NAND stage 514.

On the other hand, if none of the address bits are high during the evaluation period, the logical output of the decoder circuit will change from 0 to 1 as the SC1 pulse triggers the NAND stage 510. In particular, load transistor P6 (being active one inverter delay prior to the evaluation period) will alleviate charge sharing problems between precharged replica node 506 and node 504 in the event that node 504 was discharged during an earlier static condition.

As replica node 506 (inputted to N11) tends to remain high, the gated positive pulse SC1 causes N16 to conduct, thus pulling precharged node 514 from high to ground. This in turn switches the state of inverter stage 512 such that the decode circuit output is high.

In the embodiment of FIG. 5, PFET P15 is configured as a feedback device (similar to the case in FIG. 4) that provides an active restore of the replica node 506 to a full high voltage to counteract the downward capacitive coupling through N11. Once the evaluation period ends, positive clock signal goes low once again, thus isolating node 506 from node 504, with replica node 506 remaining precharged high due to the conduction of P2. In addition, the negative going signal SC1 deactivates NAND NFET N16, allowing P9 to precharge NAND output node 514 back to high and decode output signal WL_L back to low.

Figure 6:
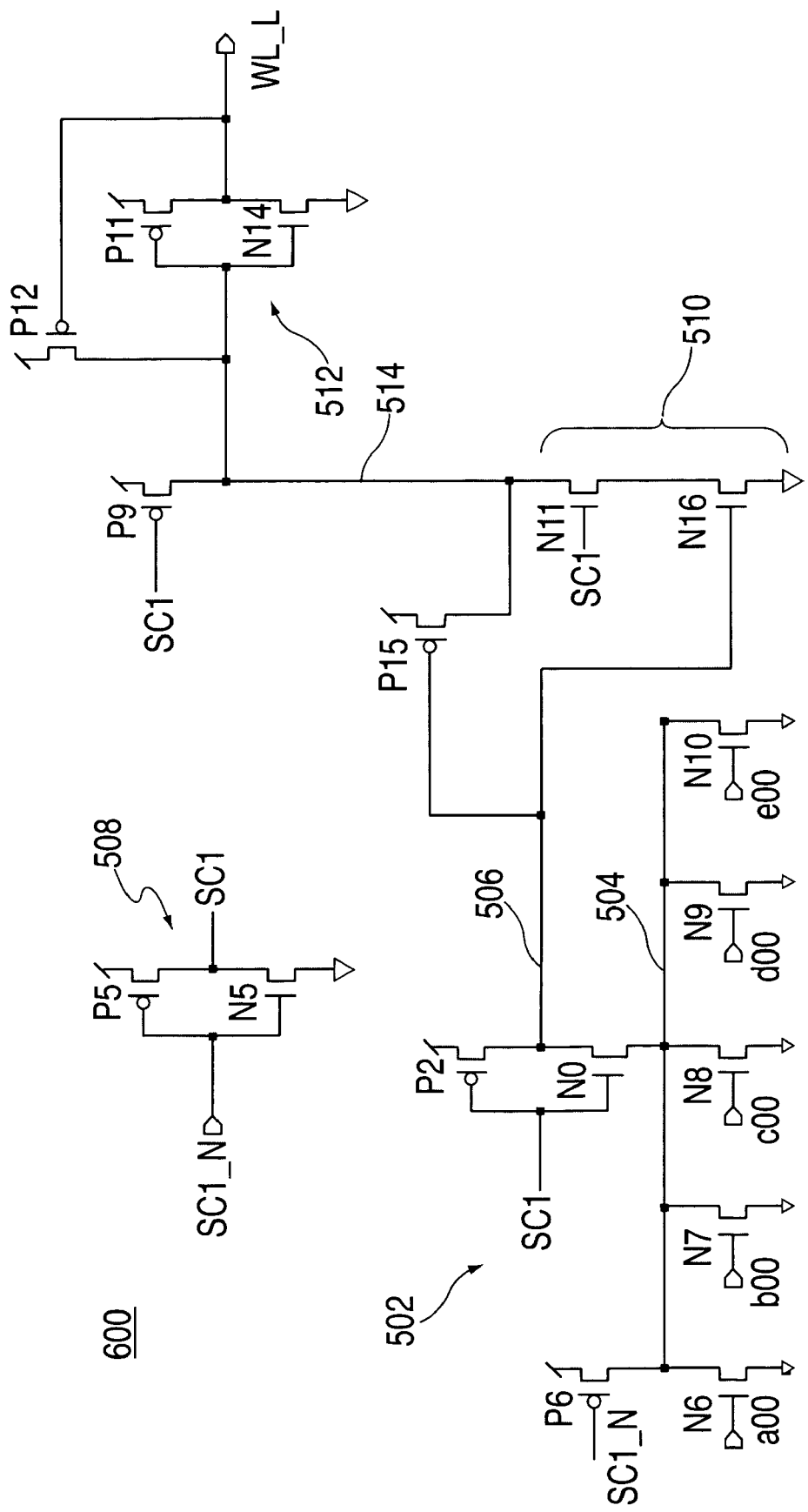
FIG. 6 is a schematic diagram of an alternative embodiment of the pulse-powered NOR decode circuit of FIG. 5.

Finally, FIG. 6 is a schematic diagram of an alternative embodiment of a pulse-powered NOR decode circuit 600. As compared to the embodiment of FIG. 5, the clock-gated NFET device of the NAND stage 510 is the top NFET in the stack, N11, while the bottom NFET of the stack, N16, is coupled to the replica node 506. This is faster than the embodiment of FIG. 5, since a NAND gate discharges quicker when the upper device switches before the lower device. Also, with both the source and drain of N16 initially at ground potential, there is no downward coupling of node 506 to reduce the conduction of N16. In addition, PFET P15 of the embodiment of FIG. 6 is configured to provide glitch reduction at NAND output node 514, since N16 is initially on fully, and there is a race condition between N0 discharging node 506 to turn off N16 and N11 turning on. However, as the replica node 506 falls to low, P15 pulls up on node 514.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A decoder circuit, comprising:
    a pulse powered stage having a plurality of fan-in inputs thereto, said pulse powered stage further comprising pseudo-NMOS logic;
    a dynamic stage fed by said pulse powered stage; and
    a replica node selectively coupled to an output node of said pulse powered stage by a pass device, wherein said pass device and said dynamic stage are controlled by a clock signal so as to enable a self timed evaluation of said pulse powered stage with a clocked enablement of said dynamic stage.

2. The decoder circuit of claim 1, wherein said pulse powered stage comprises a NOR stage and said dynamic stage comprises a dynamic AND stage.

3. The decoder circuit of claim 2, wherein said dynamic AND stage further comprises a NAND stage and an inverter stage, said NAND stage comprising an NFET stack having a first NFET controlled by said clock signal and a second NFET controlled by said replica node.

4. The decoder circuit of claim 3, wherein said clock signal is a positive clock pulse signal generated by an output of an inverter having a negative clock pulse signal input thereto.

5. The decoder circuit of claim 4, wherein said positive clock pulse signal is input to a pull up device configured to precharge said replica node.

6. The decoder circuit of claim 4, wherein said negative clock pulse signal is also input to a PFET load device coupled to said output node of said pseudo-NMOS NOR stage.

7. The decoder circuit of claim 4, wherein said first NFET in said NAND stage is the bottom NFET of said NFET stack and said second NFET in said NAND stage is the top NFET of said NFET stack.

8. The decoder circuit of claim 7, further comprising:
    a feedback PFET device controlled by an output node of said NAND stage;
    said feedback PFET device, when rendered conductive, configured to provide an active restore of said replica node.

9. The decoder circuit of claim 4, wherein said first NFET in said NAND stage is the top NFET of said NFET stack and said second NFET in said NAND stage is the bottom NFET of said NFET stack.

10. The decoder circuit of claim 9, further comprising:
    a feed forward PFET device controlled by said replica node;
    said feed forward PFET device, when rendered conductive, configured to provide glitch suppression of an output node of said NAND stage.

11. A pulse powered NOR decoder circuit, comprising:
    a pulse powered, pseudo-NMOS logic NOR stage having a plurality of fan-in inputs thereto;
    a dynamic AND stage fed by said pulse powered NOR stage;
    a replica node selectively coupled to an output node of said NOR stage by a pass device, wherein said pass device and said dynamic stage are controlled by a clock signal so as to enable a self timed evaluation of said pulse powered stage with a clocked enablement of said dynamic stage; and
    wherein a pull up device of said pseudo-NMOS NOR stage is configured to precharge said replica node to a logic high voltage prior to an evaluation of said NOR stage while said pass device isolates said replica node from said output node of said NOR stage.

12. The pulse powered NOR decoder circuit of claim 11, wherein said dynamic AND stage further comprises a NAND stage and an inverter stage, said NAND stage comprising an NFET stack having a first NFET controlled by said clock signal and a second NFET controlled by said replica node.

13. The pulse powered NOR decoder circuit of claim 12, wherein said clock signal is a positive clock pulse signal generated by an output of an inverter having a negative clock pulse signal input thereto.

14. The pulse powered NOR decoder circuit of claim 13, wherein said positive clock pulse signal is input to a pull up device configured to precharge said replica node.

15. The pulse powered NOR decoder circuit of claim 13, wherein said negative clock pulse signal is also input to a PFET load device coupled to said output node of said pseudo-NMOS NOR stage.

16. The pulse powered NOR decoder circuit of claim 13, wherein said first NFET in said NAND stage is the bottom NFET of said NFET stack and said second NFET in said NAND stage is the top NFET of said NFET stack.

17. The pulse powered NOR decoder circuit of claim 16, further comprising:
   a feedback PFET device controlled by an output node of said NAND stage;
   said feedback PFET device, when rendered conductive, configured to provide an active restore of said replica node.

18. The pulse powered NOR decoder circuit of claim 13, wherein said first NFET in said NAND stage is the top NFET of said NFET stack and said second NFET in said NAND stage is the bottom NFET of said NFET stack.

19. The pulse powered NOR decoder circuit of claim 18, further comprising:
   a feed forward PFET device controlled by said replica node;
   said feed forward PFET device, when rendered conductive, configured to provide glitch suppression of an output node of said NAND stage.

* * * * *